(12) United States Patent
Takishita et al.

(10) Patent No.: US 11,410,970 B2
(45) Date of Patent: *Aug. 9, 2022

(54) SEMICONDUCTOR MODULE

(71) Applicant: UltraMemory Inc., Tokyo (JP)

(72) Inventors: Ryuji Takishita, Tokyo (JP); Takao Adachi, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 26 days.

This patent is subject to a terminal disclaimer.

(21) Appl. No.: 16/913,524

(22) Filed: Jun. 26, 2020

(65) Prior Publication Data

US 2020/0328184 A1 Oct. 15, 2020

Related U.S. Application Data

(63) Continuation of application No. 16/618,765, filed as application No. PCT/JP2017/020686 on Jun. 2, 2017, now Pat. No. 10,741,525.

(51) Int. Cl.
*H01L 25/065* (2006.01)
*H01L 23/367* (2006.01)
(Continued)

(52) U.S. Cl.
CPC ...... *H01L 25/0655* (2013.01); *H01L 23/3672* (2013.01); *H01L 23/49811* (2013.01); *H01L 24/45* (2013.01); *H01L 25/042* (2013.01); *H01L 25/0652* (2013.01); *H01L 25/071* (2013.01); *H01L 25/112* (2013.01);
(Continued)

(58) Field of Classification Search
CPC .. H01L 25/042; H01L 25/0652; H01L 25/071
See application file for complete search history.

(56) References Cited

U.S. PATENT DOCUMENTS 5,790,384 A 8/1998 Ahmad et al.
8,304,881 B1 11/2012 Haba et al.
(Continued)

FOREIGN PATENT DOCUMENTS

JP 2008/251917 A 10/2008
JP 2010-080802 A 4/2010
(Continued)

*Primary Examiner* — David A Zarneke
(74) *Attorney, Agent, or Firm* — Muncy, Geissler, Olds & Lowe, P.C.

(57) ABSTRACT

The present invention provides a semiconductor module capable of improving a bandwidth between a logic chip and a RAM. According to the present invention, a semiconductor module 1 is provided with: a logic chip; a pair of RAM units 30 each composed of a lamination-type RAM module; a first interposer 10 electrically connected to the logic chip and to each of the pair of RAM units 30; and a connection unit 40 that communicatively connects the logic chip and each of the pair of RAM units 30, wherein one RAM unit 30a is placed on the first interposer 10, and has one end portion disposed so as to overlap, in the lamination direction C, one end portion of the logic chip with the connection unit 40 therebetween, and the other RAM unit 30b is disposed so as to overlap the one RAM unit 30a with the connection unit 40 therebetween, and is also disposed along the outer periphery of the logic chip.

4 Claims, 14 Drawing Sheets

(51) Int. Cl.
  *H01L 23/498* (2006.01)
  *H01L 23/00* (2006.01)
  *H01L 25/04* (2014.01)
  *H01L 25/07* (2006.01)
  *H01L 25/11* (2006.01)
  *H01L 27/02* (2006.01)

(52) U.S. Cl.
  CPC .. *H01L 27/0203* (2013.01); *H01L 2924/1431* (2013.01); *H01L 2924/1435* (2013.01)

(56) References Cited

U.S. PATENT DOCUMENTS

| | | |
|---|---|---|
| 8,436,458 B2 | 5/2013 | Haba et al. |
| 9,087,765 B2 | 7/2015 | Chun et al. |
| 9,449,941 B2 | 9/2016 | Tsai et al. |
| 9,553,071 B1 | 1/2017 | Haba |
| 9,640,521 B2 | 5/2017 | Chang et al. |
| 9,761,533 B2 | 9/2017 | Chaware et al. |
| 9,899,361 B2 | 2/2018 | Kim et al. |
| 10,109,616 B2 | 10/2018 | Karhade |
| 10,741,525 B2 * | 8/2020 | Takishita ............... G11C 5/025 |
| 2008/0237848 A1 | 10/2008 | Yoshikawa et al. |
| 2010/0078790 A1 | 4/2010 | Ito et al. |
| 2010/0244276 A1 | 9/2010 | Burleson et al. |
| 2012/0187578 A1 | 7/2012 | Li |
| 2012/0267777 A1 | 10/2012 | Haba et al. |
| 2015/0145116 A1 | 5/2015 | Uzoh et al. |
| 2015/0171065 A1 | 6/2015 | Guzek et al. |
| 2015/0255411 A1 | 9/2015 | Karhade et al. |
| 2015/0364422 A1 | 12/2015 | Zhai et al. |
| 2017/0062383 A1 | 3/2017 | Yee et al. |
| 2017/0200696 A1 | 7/2017 | Haba |
| 2019/0057940 A1 | 2/2019 | Cheah et al. |
| 2020/0042450 A1 | 2/2020 | Louie et al. |

FOREIGN PATENT DOCUMENTS

| | | |
|---|---|---|
| JP | 2010-232659 A | 10/2010 |
| JP | 2011-508936 A | 3/2011 |
| JP | 2013-501380 A | 1/2013 |
| JP | 2014-512691 A | 5/2014 |
| WO | WO-2009/079749 A1 | 7/2009 |

* cited by examiner

SEMICONDUCTOR MODULE

CROSS REFERENCE TO RELATED APPLICATIONS

This application is a Continuation of co-pending application Ser. No. 16/618,765, filed on Dec. 2, 2019, which is a 371 of International Application No. PCT/JP2017/020686, filed on Jun. 2, 2017, the entire contents of all of which are hereby incorporated by reference.

TECHNICAL FIELD

The present invention relates to a semiconductor module.

BACKGROUND ART

In the related art, a volatile memory (RAM) such as a dynamic random access memory (DRAM) is known as a storage device. DRAMs are required to have high performance of an arithmetic unit (hereinafter referred to as a logic chip) and a large capacity capable of withstanding an increase in amount of data. Therefore, the capacity has been increased by miniaturizing a memory (memory cell array, memory chip) and increasing the number of cells in a plane. On the other hand, this type of increase in capacity has reached its limit due to the weakness to noise caused by the miniaturization, the increase in die area, and the like.

Therefore, in recent years, a technology has been developed that realizes a large capacity by laminating a plurality of planar memories to form a three-dimensional (3D) structure. In addition, there has been proposed a semiconductor module that reduces an installation area of the logic chip and the RAM by overlapping the logic chip and RAM (see, for example, Patent Documents 1 to 4).

Patent Document 1: Japanese Unexamined Patent Application (Translation of PCT Application), Publication No. 2014-512691
Patent Document 2: Japanese Unexamined Patent Application (Translation of PCT Application), Publication No. 2013-501380
Patent Document 3: Japanese Unexamined Patent Application, Publication No. 2010-232659
Patent Document 4: Japanese Unexamined Patent Application, Publication No. 2010-80802

DISCLOSURE OF THE INVENTION

Problems to be Solved by the Invention

With the increase in performance of the logic chip and the increase in amount of data, an improvement in communication rate between the logic chip and the RAM is also required along with the increase in capacity. Therefore, it is preferable to provide a semiconductor module capable of improving a bandwidth between the logic chip and the RAM.

An object of the invention is to provide a semiconductor module capable of improving a bandwidth between a logic chip and a RAM.

Means for Solving the Problems

The invention relates to a semiconductor module including: a logic chip; a pair of RAM units, each of which is configured with a lamination-type RAM module; a first interposer electrically connected to the logic chip and each of the pair of RAM units; and a connection unit that communicatively connects the logic chip and each of the pair of RAM units, in which one RAM unit is placed on the first interposer and has one end portion disposed so as to overlap one end portion of the logic chip with the connection unit therebetween in a lamination direction, and in which the other RAM unit is disposed so as to overlap the one RAM unit with the connection unit therebetween and is disposed along at least one side of the outer periphery of the logic chip.

In addition, it is preferable that each of the pair of RAM units include a memory unit in which memory circuits are laminated, and an interface chip laminated on one end side of the memory unit.

In addition, it is preferable that each of the pair of RAM units be disposed with the interface chips facing each other.

In addition, it is preferable that, in each of the pair of RAM units, the interface chip be disposed on a surface opposite to a surface facing the first interposer.

In addition, it is preferable that the other RAM unit be configured to include only the memory unit.

In addition, it is preferable that the semiconductor module further include a second interposer placed on the other RAM unit, a third interposer or a package substrate on which the first interposer is placed, and a bonding wire that electrically connects the second interposer and the third interposer or the package substrate.

In addition, it is preferable that the semiconductor module further include a second interposer placed on the other RAM unit and a columnar member that electrically connects the first interposer and the second interposer.

In addition, it is preferable that the semiconductor module further include a heat sink unit placed on the other RAM unit and the logic chip.

In addition, it is preferable that the heat sink unit include a spacer member adjacent to at least one of the other RAM unit and the logic chip.

In addition, it is preferable that each of the pair of RAM units include a lamination-type RAM module having the same shape and size in plan view.

Effects of the Invention

According to the invention, it is possible to provide a semiconductor module capable of improving a bandwidth between a logic chip and a RAM.

PREFERRED MODE FOR CARRYING OUT THE INVENTION

Figure 1:
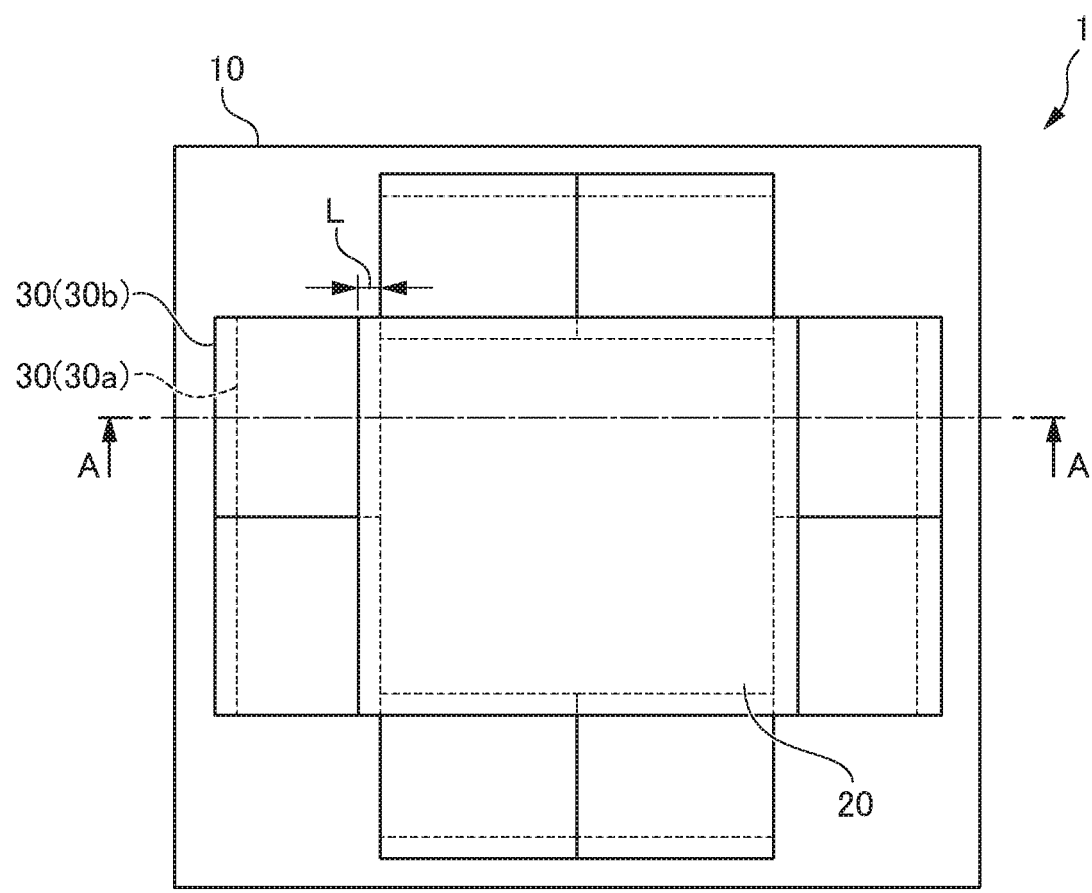
FIG. 1 is a schematic plan view illustrating a semiconductor module according to a first embodiment of the invention.

Hereinafter, semiconductor modules according to embodiments of the invention will be described with reference to the drawings. The semiconductor module according to each embodiment is, for example, a system in a package (SIP) in which arithmetic units (hereinafter referred to as logic chips) and lamination-type RAMS are disposed on an interposer. The semiconductor module is disposed on a different interposer and is electrically connected by using micro bumps. The semiconductor module is a device that can obtain power from different interposers and can transmit and receive data to and from different interposers. In addition, in each of the following embodiments, an MPU will be described as an example of the logic chip.

First Embodiment

Next, a semiconductor module 1 according to a first embodiment of the invention will be described with reference to FIGS. 1 to 5. The semiconductor module 1 includes a first interposer 10, an MPU 20, a pair of RAM units 30, a connection unit 40, and a heat sink unit 50 as illustrated in FIGS. 1 to 4.

Figure 3:
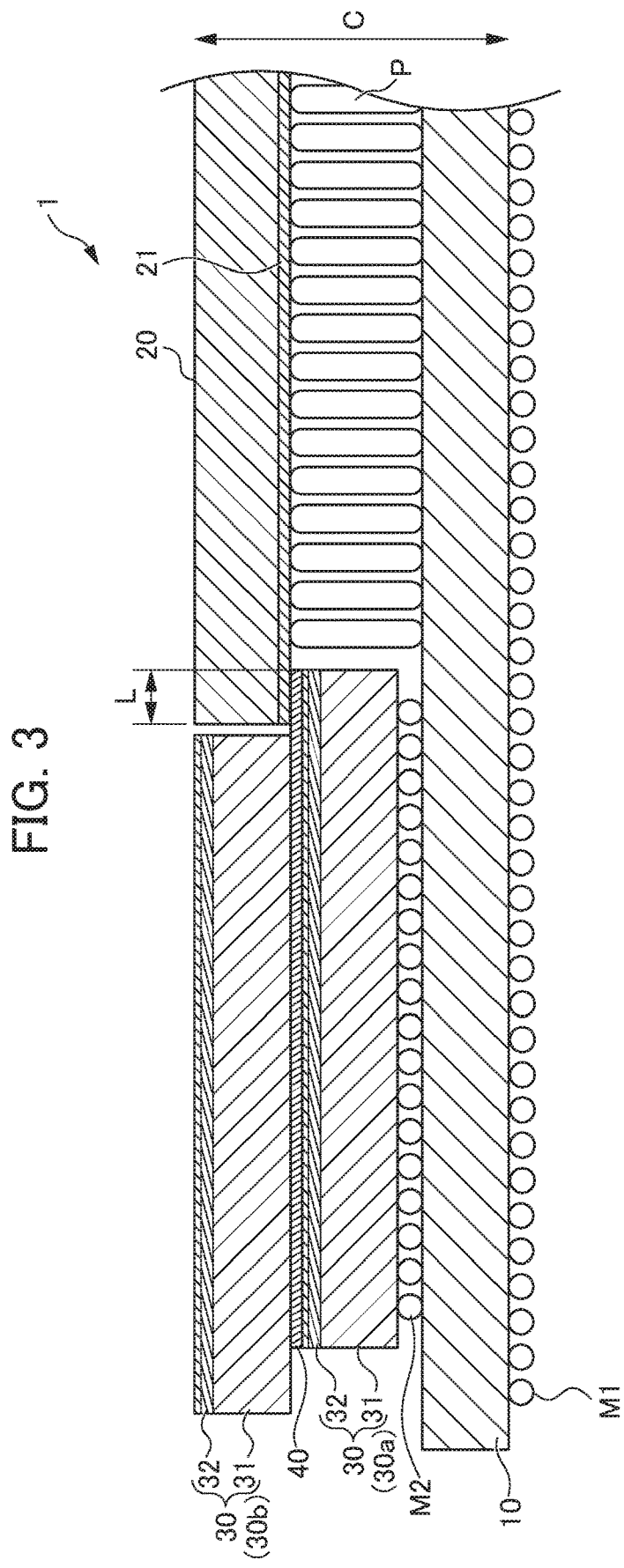
FIG. 3 is a cross-sectional view taken along line A-A of FIG. 1.

As illustrated in FIGS. 1 and 3, the first interposer 10 is a plate-like body having a rectangular shape in plan view, and an electric circuit is formed therein. The first interposer 10 is electrically connected to the MPU 20 and the pair of RAM units 30 to be described later. The first interposer 10 is disposed on a different interposer or a package substrate (not illustrated), and one surface (lower surface) thereof is electrically connected to the different interposer or the package substrate by using, for example, micro bumps M1. In addition, in the following, a thickness direction of the first interposer 10 will be described as a lamination direction C. In addition, in the lamination direction C, the direction from the first interposer 10 toward the different interposer or the package substrate is described as downward. In addition, in the lamination direction C, the direction opposite to the downward is described as upward.

The MPU 20 is a plate-like body having a rectangular shape in plan view. As illustrated in FIG. 3, in the MPU 20, a circuit surface 21 that functions as a power supply terminal, a communication terminal, and a ground terminal is disposed on the lower surface side. The circuit surface 21 of the MPU 20 is electrically connected to the first interposer 10 via pillars P (for example, Cu pillars) configured on the upper surface of the first interposer 10.

Each of the pair of RAM units 30 is configured to include a lamination-type RAM module having a rectangular shape in plan view. For example, each of the pair of RAM units 30 is configured to include a lamination-type DRAM module. As illustrated in FIG. 1, the pair of RAM units 30 are disposed on the upper surface of the first interposer 10 and, although not particularly limited, may be disposed so as to surround the MPU 20. In the embodiment, although not particularly limited, eight pairs of RAM units 30 may be disposed, and two pairs of the RAM units 30 may be disposed for each side of the MPU 20. Each of the pair of RAM units 30 includes a lamination-type RAM module having the same shape and size in plan view. For example, each of the pair of RAM units 30 can be manufactured in the same lot.

The one of the pair of RAM units 30 (hereinafter referred to as the one RAM unit 30a) is placed on the first interposer 10 as illustrated in FIG. 3. In addition, one end portion of the one RAM unit 30a is disposed so as to overlap one end portion of the MPU 20 in the lamination direction C with the later-described connection unit 40 therebetween. Specifically, one end portion of the one RAM unit 30a is disposed so as to be interposed between the one end portion of the MPU 20 and the first interposer 10. By disposing a plurality of the one RAM units 30a on the first interposer 10, a rectangular region surrounded by the plurality of the one RAM units 30a is formed. The rectangular region formed by the one RAM unit 30a is formed to have an area smaller than the area of the lower surface of the MPU 20. The lower surface facing the upper surface of the first interposer 10 of the one RAM unit 30a is electrically connected to the first interposer 10 by using micro bumps M2.

As illustrated in FIGS. 1 and 3, the other of the pair of RAM units 30 (hereinafter referred to as the other RAM unit 30b) overlaps the one RAM unit 30a with the later-described connection unit 40 therebetween. In addition, the other RAM unit 30b is disposed along the outer periphery of the MPU 20. That is, the other RAM unit 30b is disposed adjacent to the MPU 20, and one end surface (one side surface) perpendicular to the lamination direction C is disposed to face one side surface of the MPU 20.

By disposing a plurality of the other RAM units 30b on the one RAM unit 30a, a rectangular region surrounded by a plurality of the other RAM units 30b is formed. The rectangular region formed by the other RAM unit 30b is formed to have an area equal to or larger than the area of the lower surface of the MPU 20. That is, the other RAM unit 30b overlaps the one RAM unit 30a in a state shifted by the overlapping width L (the intrusion length of the one end portion of the one RAM unit 30a interposed between the first interposer 10 and the MPU 20) or more of the one RAM unit 30a overlapping the MPU 20. Accordingly, the other RAM unit 30b is disposed so as to protrude by an overlapping width L or more from the other end edge on the side opposite to the one end portion of the one RAM unit 30a.

Figure 2:
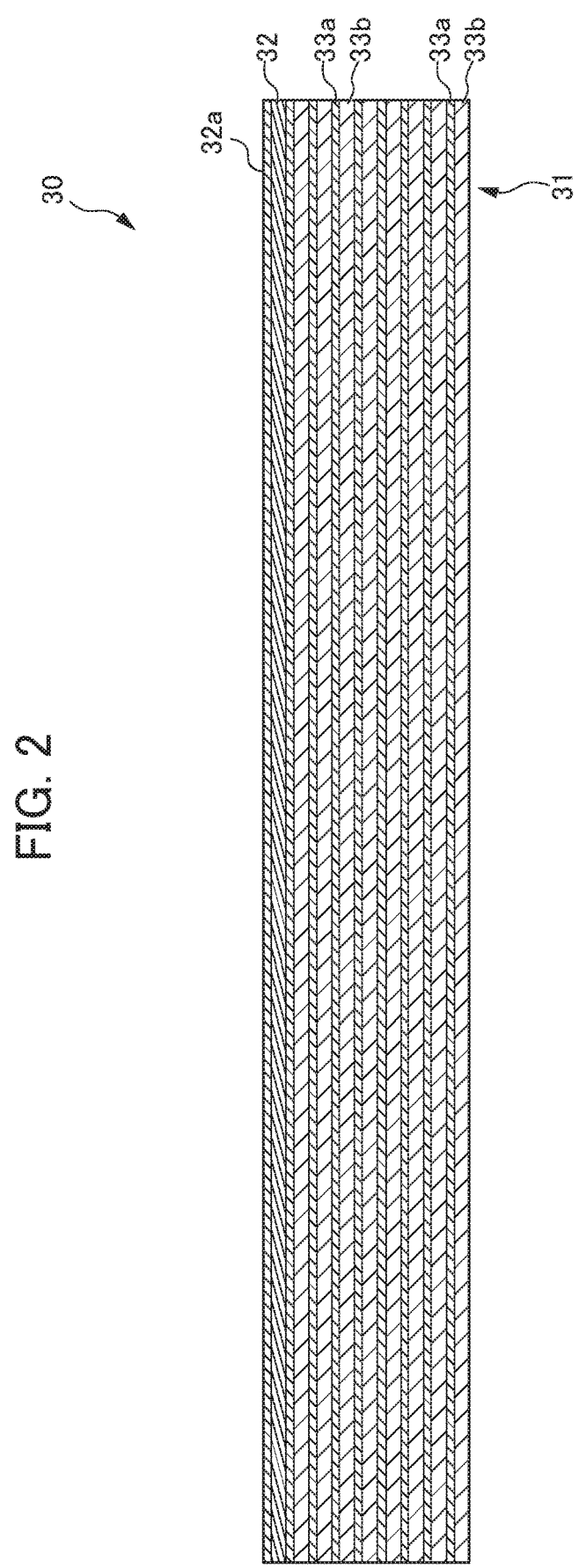
FIG. 2 is a cross-sectional view illustrating a lamination-type RAM module of the semiconductor module according to the first embodiment.

Each of the pair of RAM units 30 includes a memory unit 31 and an interface chip 32 as illustrated in FIG. 2. In the embodiment, in each of the pair of RAM units 30, the later-described interface chip 32 is disposed on a surface (upper surface) opposite to a surface (lower surface) facing the first interposer 10. That is, the later-described interface chip 32 of the one RAM unit 30a is disposed to face the circuit surface 21 of the MPU 20 with the later-described connection unit 40 therebetween. In addition, the later-described interface chip 32 of the other RAM unit 30b is disposed on a surface (upper surface) opposite to a surface (lower surface) facing the connection unit 40 to be described later.

The memory unit 31 is formed in a plate-like body having a rectangular shape in plan view and is formed by laminating memory circuits 33a. Specifically, the memory unit 31 is formed by laminating dies 33b, which are plate-like bodies having a rectangular shape in plan view, having the memory circuits 33a on the upper surface in the lamination direction C. The die 33b is an Si substrate in which a circuit is formed, and each of the laminated dies 33b is electrically connected to the adjacent die 33b. A power supply terminal and a ground terminal that connect the laminated dies 33b are formed by, for example, bumpless TSV, and a signal line is formed by ThruChip interface (TCI).

The interface chip 32 is formed in a plate-like body having a rectangular shape in plan view. The interface chip 32 is laminated on one end side (upper surface side) of the memory unit 31. Specifically, the interface chip 32 is laminated on the memory circuit 33a of the die 33b laminated at the uppermost position in the lamination direction C. A communication circuit 32a for communication is formed on the upper surface of the interface chip 32. The power supply terminal and the ground terminal that connect the interface chip 32 and the memory unit 31 are formed by, for example, bumpless TSV, and the signal line is formed by TCI.

The connection unit 40 is a communication interface that connects the MPU 20 and each of the pair of RAM units 30 and is formed in, for example, a layered shape. The connection unit 40 communicatively connects the MPU 20 and the pair of RAM units 30. That is, the MPU 20 and the pair of RAM units 30 are communicatively connected to each other. The connection unit 40 is disposed on the surface (upper surface) opposite to the surface (lower surface) placed on the first interposer 10 among the surfaces of the one RAM unit 30a. That is, the connection unit 40 is disposed with the one portion thereof interposed between the pair of RAM units 30 and with the other portion thereof interposed between the one RAM unit 30a and the MPU 20. The connection unit 40 is, for example, an anisotropic conductive film (ACF) and functions as a power supply terminal and a signal line.

Figure 4:
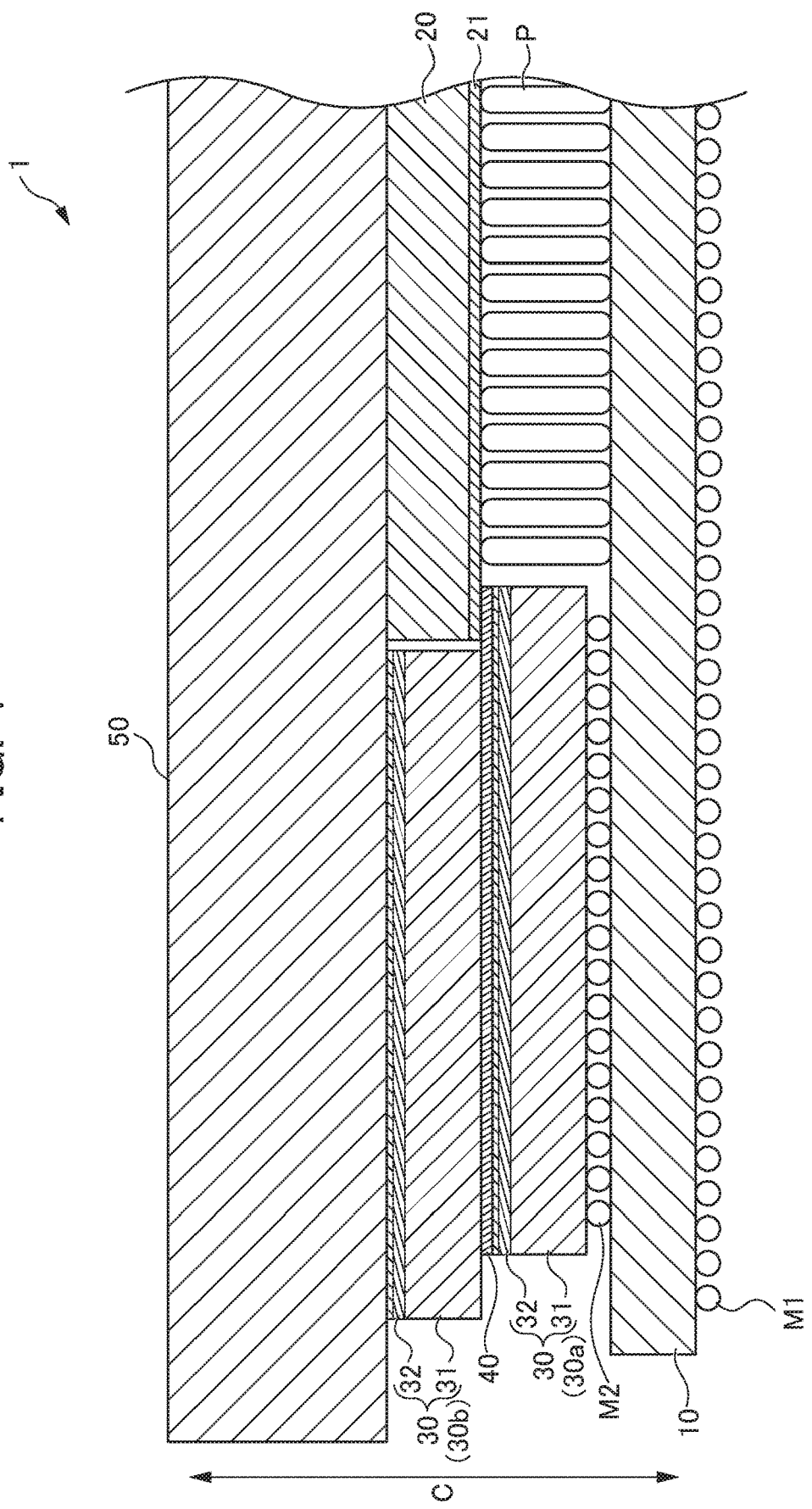
FIG. 4 is a cross-sectional view of the semiconductor module according to the first embodiment in which a heat sink unit is placed.

As illustrated in FIG. 4, the heat sink unit 50 is placed on the other RAM unit 30b and the MPU 20. That is, the heat sink unit 50 is disposed across the other RAM unit 30b and the MPU 20. In the embodiment, the heat sink unit 50 is disposed so as to cover the upper surface (the surface opposite to the surface facing the first interposer 10) of the other RAM unit 30b and the MPU 20. A paste or adhesive having a high thermal conductivity or other plate-like substance may be interposed between the heat sink unit 50, the other RAM unit 30b, and the MPU 20.

Figure 5:
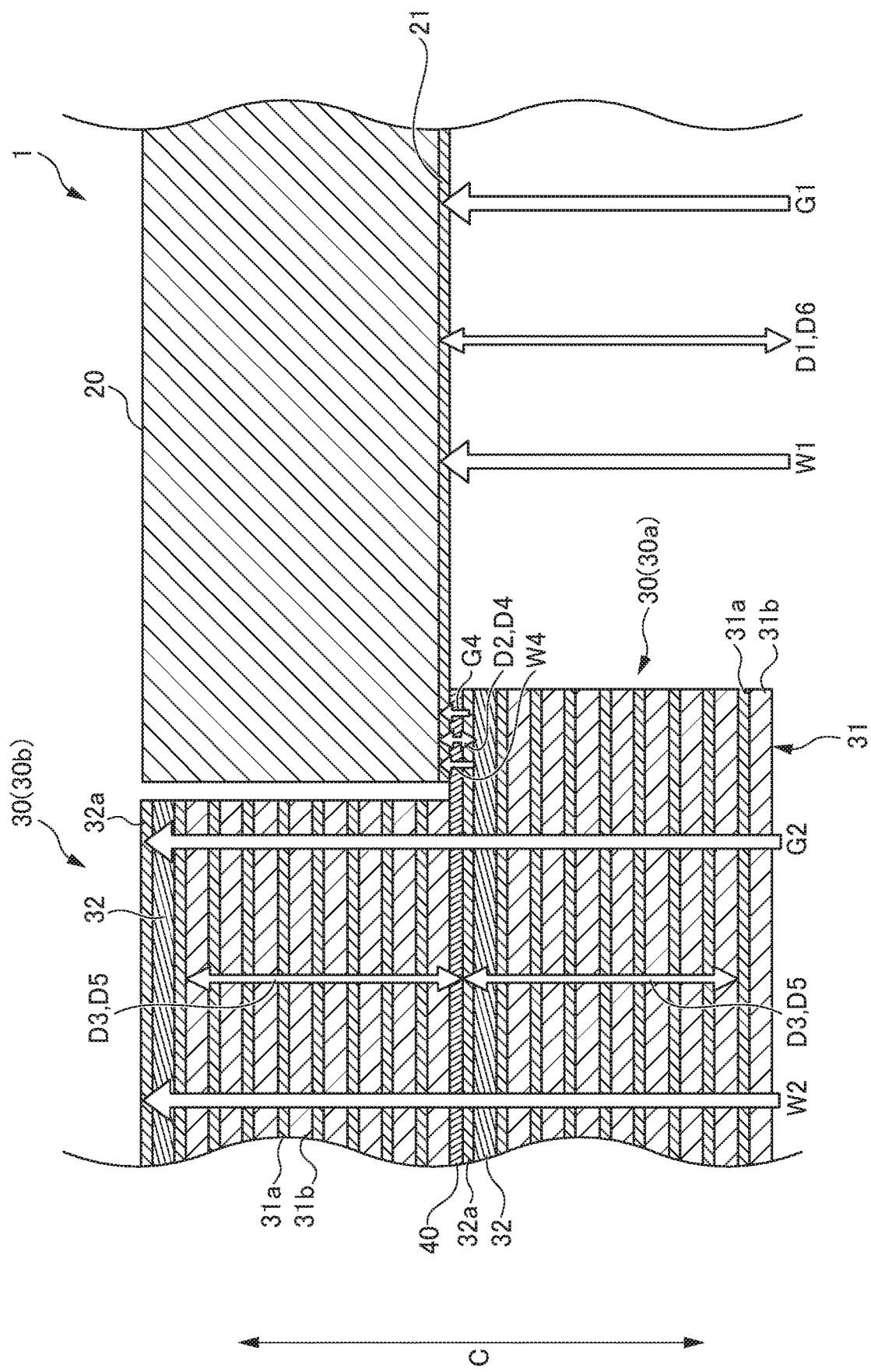
FIG. 5 is a conceptual diagram illustrating a flow of power supply and data communication in the semiconductor module according to the first embodiment.

Next, operations of the semiconductor module 1 will be described. First, as illustrated in FIG. 5, a power W1 is supplied from the first interposer 10 to the MPU 20. In addition, a power W2 is supplied from the first interposer 10 to the one RAM unit 30a. The power W2 supplied to the one RAM unit 30a is also supplied to the other RAM unit 30b with the connection unit 40 therebetween. The MPU 20 is ground-connected (ground G1) to the first interposer 10. The pair of RAM units 30 are ground-connected (ground G2) to the first interposer 10. A power W4 and a ground G4 may be supplied from the interface chip 32 to the MPU 20 with the connection unit 40 therebetween.

In a case where a data is stored in the pair of RAM units 30, first, a data D1 is transmitted from the first interposer 10 to the MPU 20. The MPU 20 transmits a calculation result calculated on the basis of the data D1 to the pair of RAM units 30 as a store signal (data D2). That is, the store signal transmitted from the MPU 20 is transmitted through the circuit surface 21 and the connection unit 40 of the MPU 20 to the interface chip 32 of the one RAM unit 30a.

The interface chip 32 stores the data included in the store signal in the memory unit 31 on the basis of the address included in the store signal (data D3). At this time, the interface chip 32 also controls the other RAM unit 30b. That is, in a case where the address included in the store signal is included in the other RAM unit 30b, the interface chip 32 stores the data included in the store signal at the corresponding address in the other RAM unit 30b.

On the other hand, in a case where a data is loaded from the pair of RAM units 30, first, a load signal is transmitted from the first interposer 10 to the MPU 20 (data D6). That is, the load signal transmitted from the MPU 20 is transmitted through the circuit surface 21 and the connection unit 40 of the MPU 20 to the interface chip 32 of the one RAM unit 30a.

The interface chip 32 loads the data from the corresponding address in the memory unit 31 on the basis of the address included in the load signal (data D5). At this time, the interface chip 32 also controls the other RAM unit 30b. That is, in a case where the address included in the load signal is included in the other RAM unit 30b, the interface chip 32 loads the data from the corresponding address in the other RAM unit 30b. The interface chip 32 transmits the loaded data to the MPU 20 with the connection unit 40 therebetween (data D4).

The semiconductor module 1 according to the first embodiment as described above has the following effects.

(1) The semiconductor module 1 is configured to include the MPU 20 (logic chip), a pair of the RAM units 30 each of which is configured with the lamination-type RAM module, and the first interposer 10 which is electrically connected to the MPU 20 and each of the pair of RAM units 30, and the connection unit 40 which communicatively connects the MPU 20 and each of the pair of RAM units 30. Then, the one end portion of one of the pair of RAM units 30 is disposed so as to overlap the one end portion of the MPU 20 in the lamination direction C with the connection unit 40 therebetween, and the other of the pair of RAM units 30 is disposed so as to overlap the one RAM unit 30a with the connection unit 40 therebetween and is disposed along at least one side of the outer periphery of the MPU 20. Accordingly, since the MPU 20 and each of the pair of RAM units 30 can be directly connected to each other by the connection unit 40, the signal line between the MPU 20 and each of the pair of RAM units 30 can be shortened. Therefore, the bandwidth between the MPU 20 and the pair of RAM units 30 can be widened. In addition, the capacity of the RAM units 30 can be easily increased by configuring a pair of the RAM units 30 with a lamination-type RAM module. Furthermore, the lamination-type RAM module can be manufactured separately, and thus, the yield can be improved as compared with a case where the RAM unit 30 is manufactured with a single lamination-type RAM module.

(2) Each of the pair of RAM units 30 is configured to include the memory unit 31 in which the memory circuits 33a are laminated and the interface chip 32 which is laminated on the one end side of the memory unit 31.

Accordingly, the memory unit 31 can be controlled by using the interface chip 32. Therefore, the memory unit 31 can be appropriately controlled.

(3) In each of the pair of RAM units 30, the interface chip 32 is disposed on the surface side opposite to the surface facing the first interposer 10. Accordingly, since the disposition can be performed without changing the direction of the lamination direction of the RAM units 30, the ease of manufacturing improves.

(4) The semiconductor module 1 is further configured to include the heat sink unit 50 placed on the other RAM unit 30b and the MPU 20. Accordingly, efficient heat dissipation can be performed from both the RAM unit 30 and the MPU 20.

(5) Each of the pair of RAM units 30 is configured to include the lamination-type RAM module having the same shape and size in plan view. Accordingly, since it is not necessary to manufacture the lamination-type RAM module corresponding to each of the pair of RAM units 30 according to individual standards, the manufacturing cost can be reduced.

(6) The power W4 and the ground G4 are supplied from the interface chip 32 to the MPU 20 with the connection unit 40 therebetween. Accordingly, a common power can be supplied to the drive circuit that drives the signal line between the interface chip 32 and the MPU 20, and thus, malfunction due to a phase shift of power source noise can be effectively suppressed.

Second Embodiment

Figure 6:
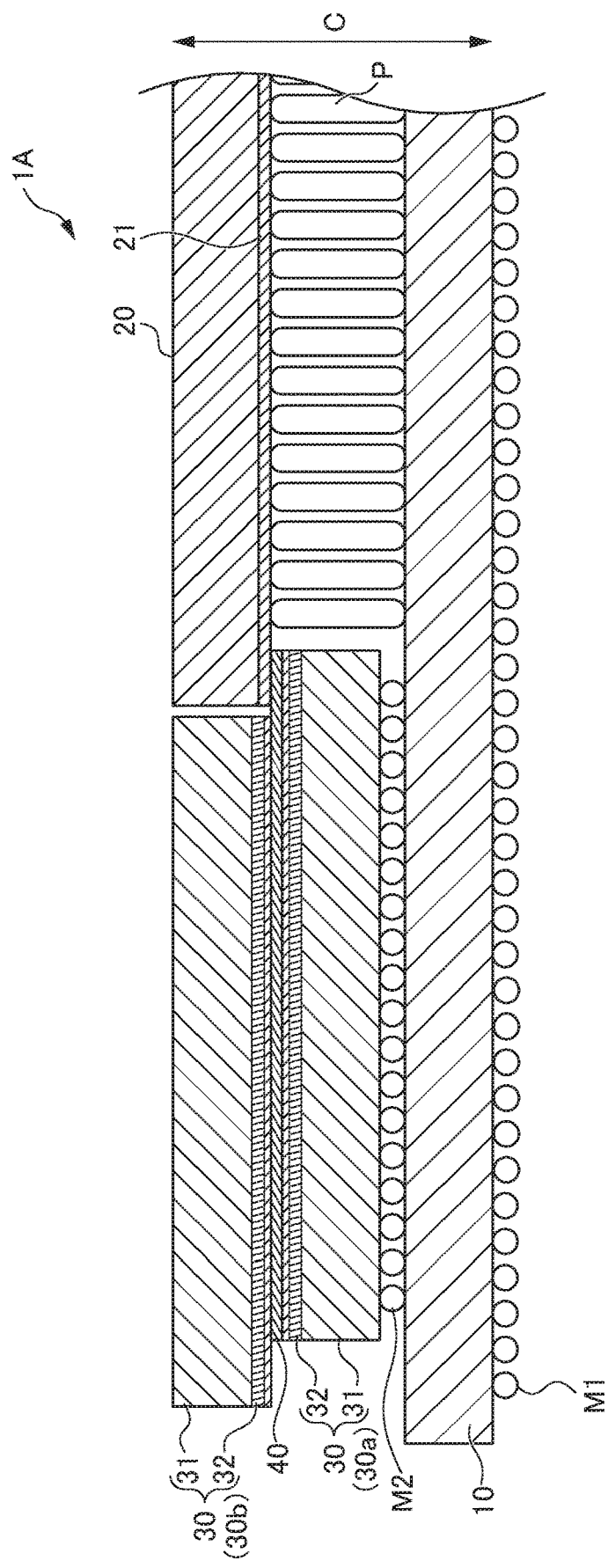
FIG. 6 is a cross-sectional view illustrating a semiconductor module according to a second embodiment of the invention.
Figure 7:
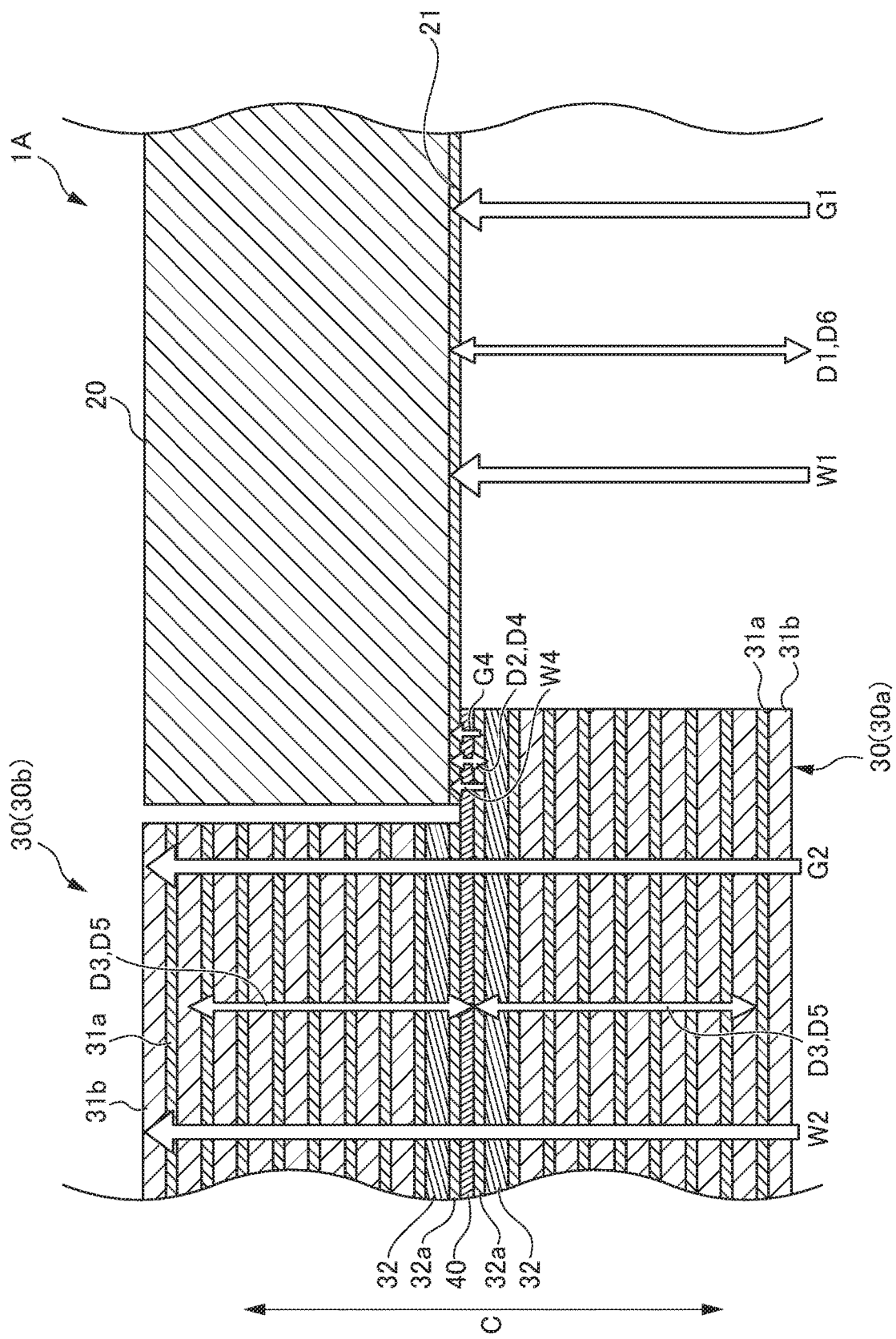
FIG. 7 is a conceptual diagram illustrating a flow of power supply and data communication in the semiconductor module according to the second embodiment.

Next, a semiconductor module 1A according to a second embodiment of the invention will be described with reference to FIGS. 6 and 7. In the description of the second embodiment, the same components are denoted by the same reference numerals, and the description thereof is omitted or simplified. As illustrated in FIG. 6, the semiconductor module 1A according to the second embodiment is different from the first embodiment in that each of the pair of RAM units 30 is disposed with the interface chips 32 facing each other. As illustrated in FIG. 7, the semiconductor module 1A according to the second embodiment is different from the first embodiment in that each of the interface chip 32 of the one RAM unit 30a and the interface chip 32 of the other RAM unit 30b manages the memory unit 31 of each RAM unit 30.

The semiconductor module 1A according to the second embodiment as described above has the following effects.

(7) Each of the pair of RAM units 30 is disposed with the interface chips 32 facing each other. Accordingly, each of the pair of RAM units 30 can be controlled by separate interface chips 32.

Third Embodiment

Figure 8:
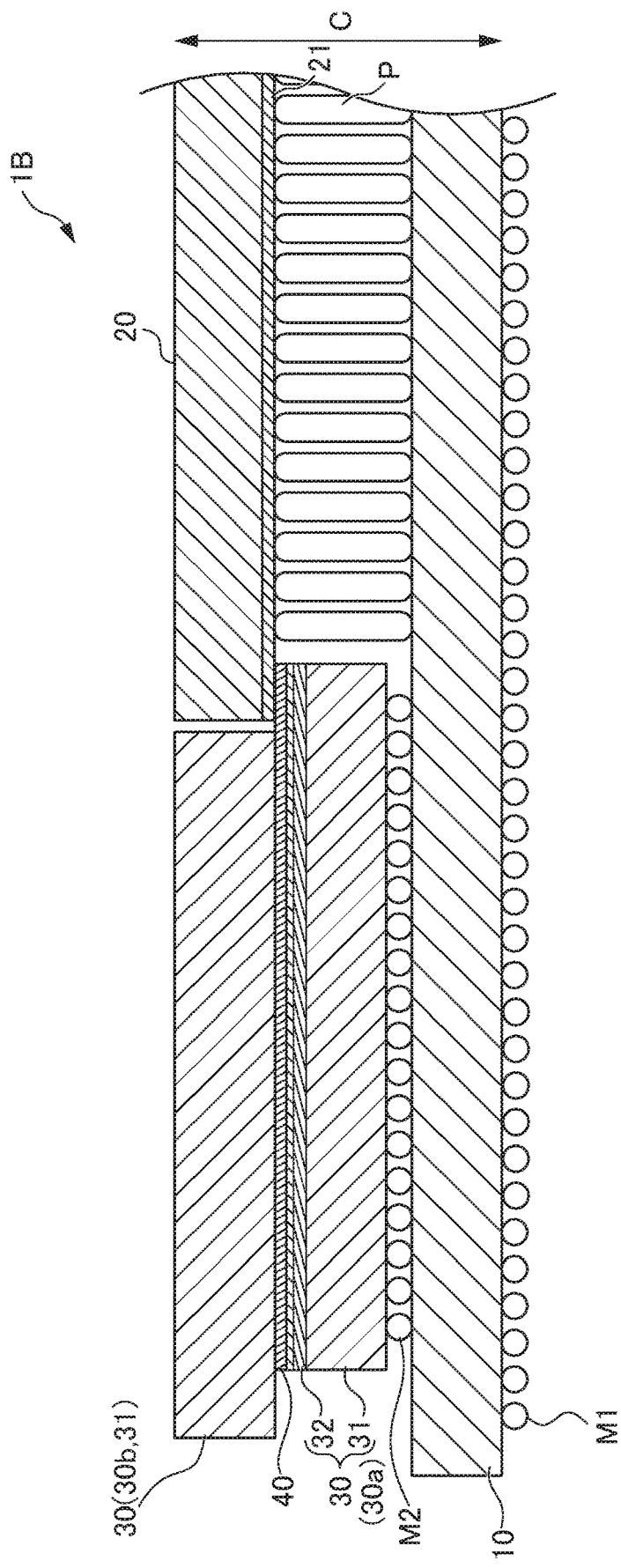
FIG. 8 is a cross-sectional view illustrating a semiconductor module according to a third embodiment of the invention.
Figure 9:
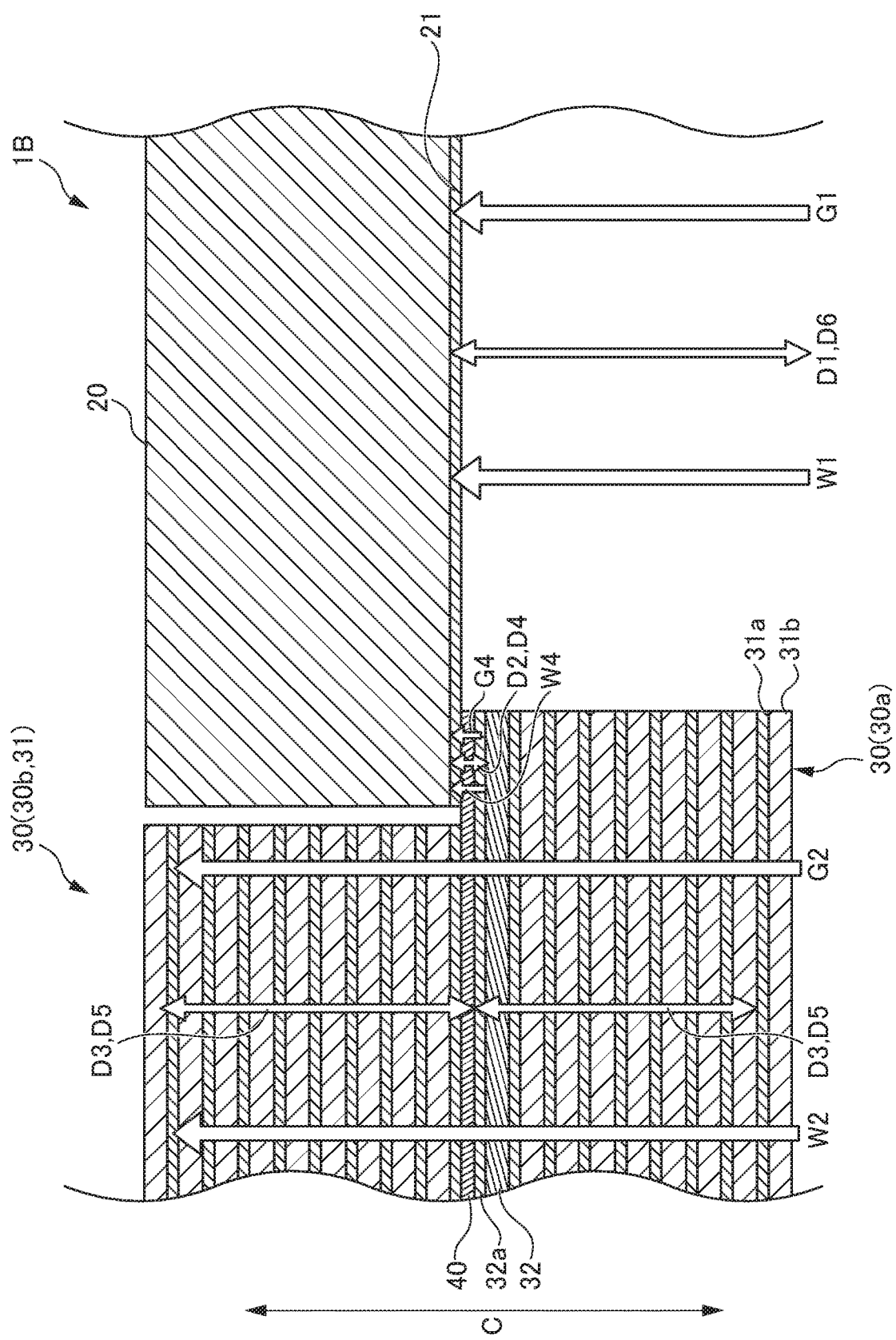
FIG. 9 is a conceptual diagram illustrating a flow of power supply and data communication in the semiconductor module according to the third embodiment.

Next, a semiconductor module 1B according to a third embodiment of the invention will be described with reference to FIGS. 8 and 9. In the description of the third embodiment, the same components are denoted by the same reference numerals, and the description thereof is omitted or simplified. As illustrated in FIG. 8, the semiconductor module 1B according to the third embodiment is different from the first and second embodiments in that the other RAM unit 30b is configured to include only the memory unit 31. In the semiconductor module 1B according to the third embodiment, as illustrated in FIG. 9, the interface chip 32 of the one RAM unit 30a manages both the RAM units in the pair of RAM units 30 similarly to the first embodiment.

The semiconductor module 1B according to the third embodiment as described above has the following effects.

(8) The other RAM unit 30b is configured to include only the memory unit 31. Accordingly, the yield of the semiconductor module 1B can be improved and the manufacturing cost can be reduced.

Fourth Embodiment

Figure 10:
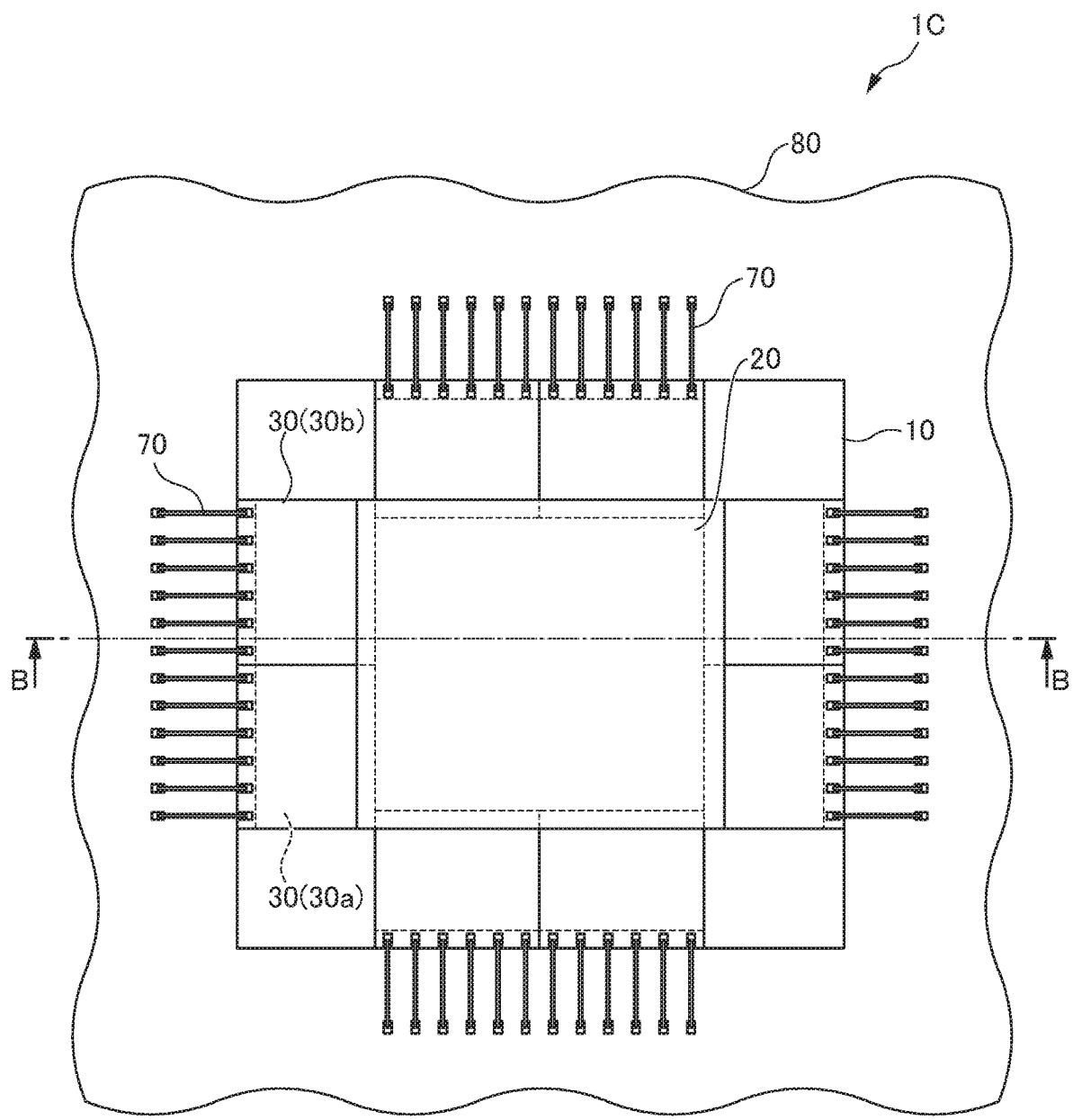
FIG. 10 is a schematic plan view illustrating a semiconductor module according to a fourth embodiment of the invention.
Figure 11:
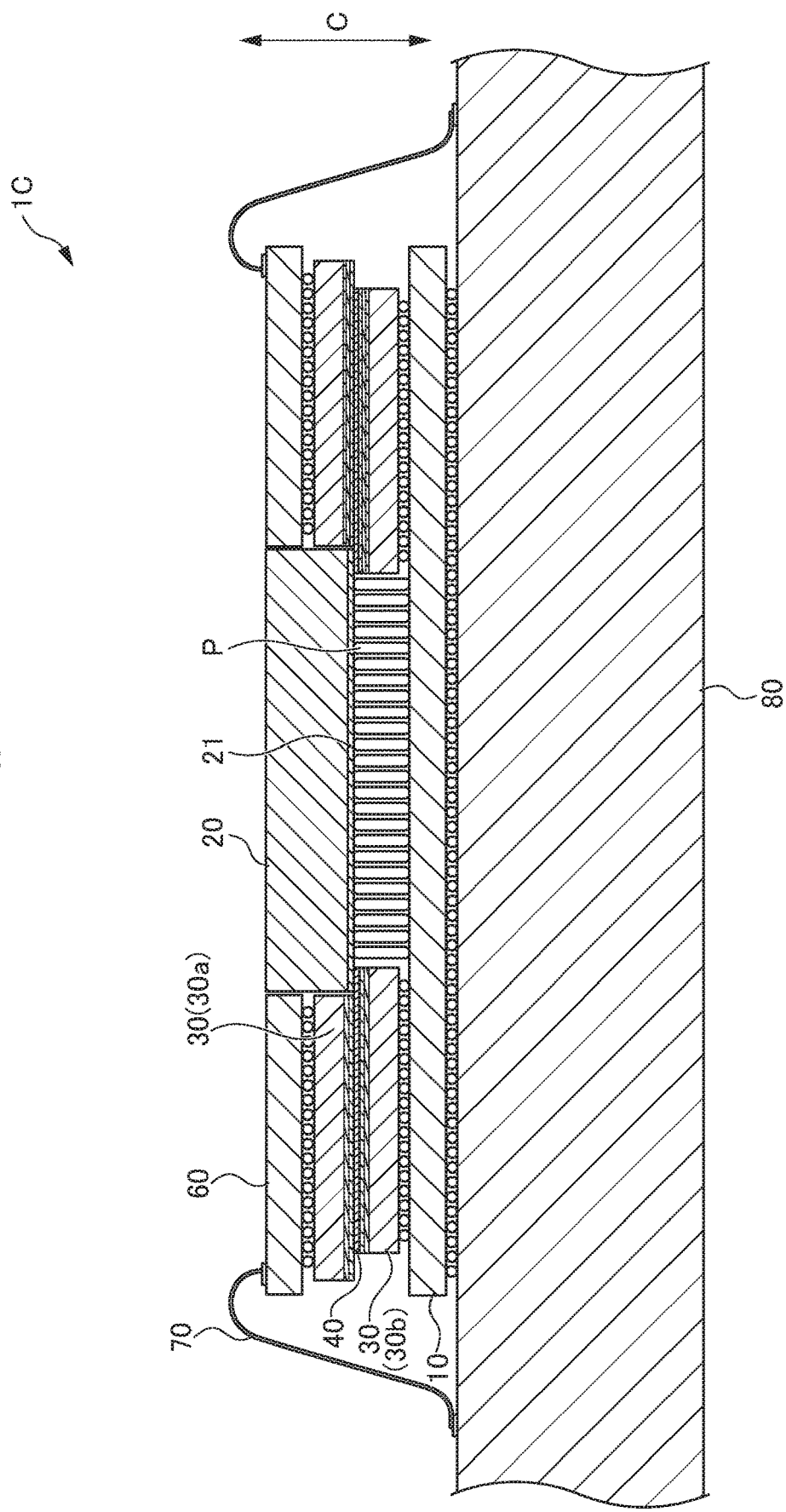
FIG. 11 is a cross-sectional view taken along line B-B of FIG. 10.
Figure 12:
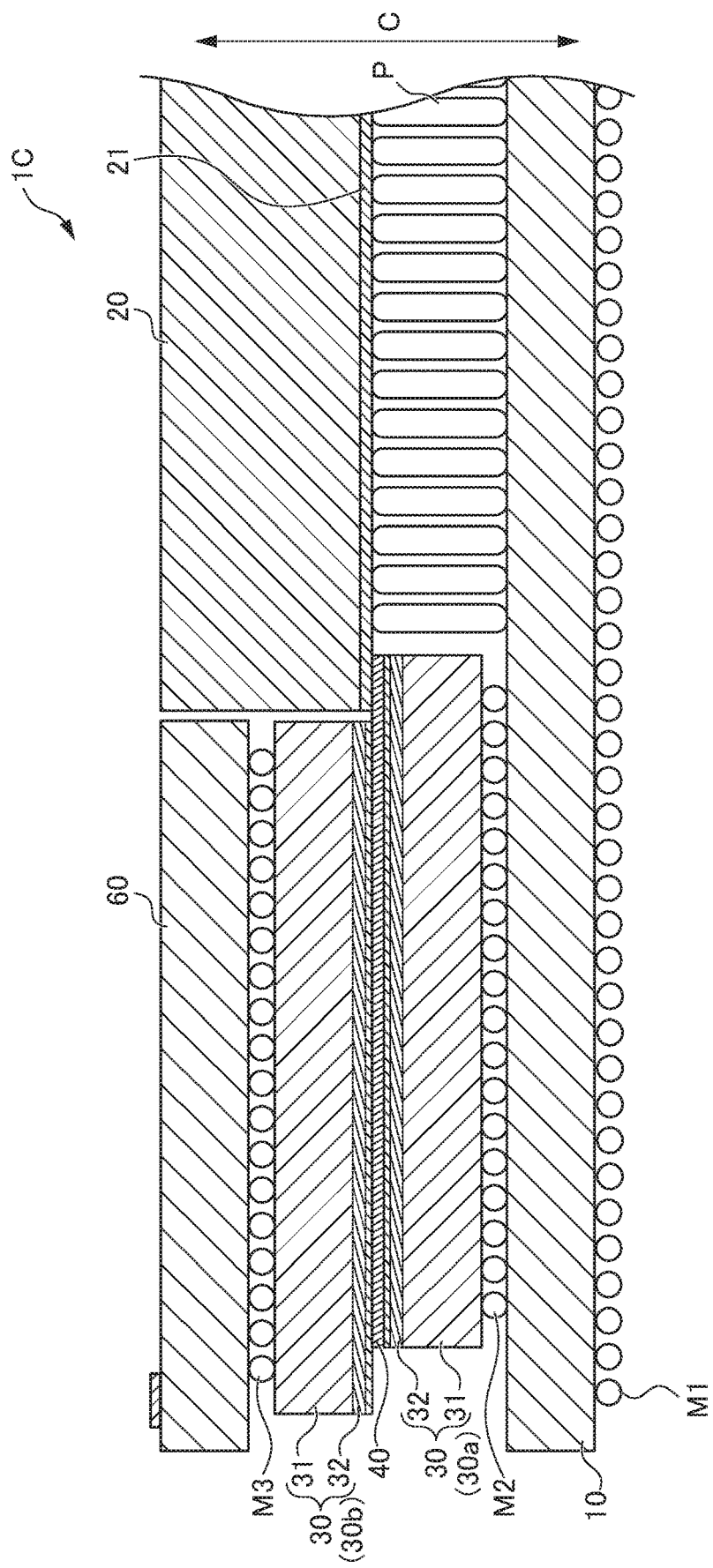
FIG. 12 is a partially enlarged view of a RAM unit of FIG. 11.

Next, a semiconductor module 1C according to a fourth embodiment of the invention will be described with reference to FIGS. 10 to 13. In the description of the fourth embodiment, the same components are denoted by the same reference numerals, and the description thereof is omitted or simplified. As illustrated in FIGS. 10 to 12, the semiconductor module 1C according to the fourth embodiment is different from the second embodiment in that the semiconductor module 1C includes a second interposer 60, a third interposer or a package substrate 80, and a bonding wire 70.

The second interposer 60 is formed to have a rectangular shape in plan view. For example, the second interposer 60 is placed on the other RAM unit 30b and is electrically connected to the other RAM unit 30b by using micro bumps M3. In the embodiment, the second interposer 60 is formed to have substantially the same shape and size as the other RAM unit 30b in plan view. The first interposer 10 is placed on the third interposer or the package substrate 80. The third interposer or package substrate 80 is electrically connected to the first interposer 10 by using the micro bumps M1.

The bonding wire 70 is disposed so as to supply a power W3 and a ground G3 to the other RAM unit 30b. One end of the bonding wire 70 is connected to the third interposer or the package substrate 80 by using a bonding pad or the like, and the other end thereof is connected to the second interposer 60 by using a bonding pad or the like.

Figure 13:
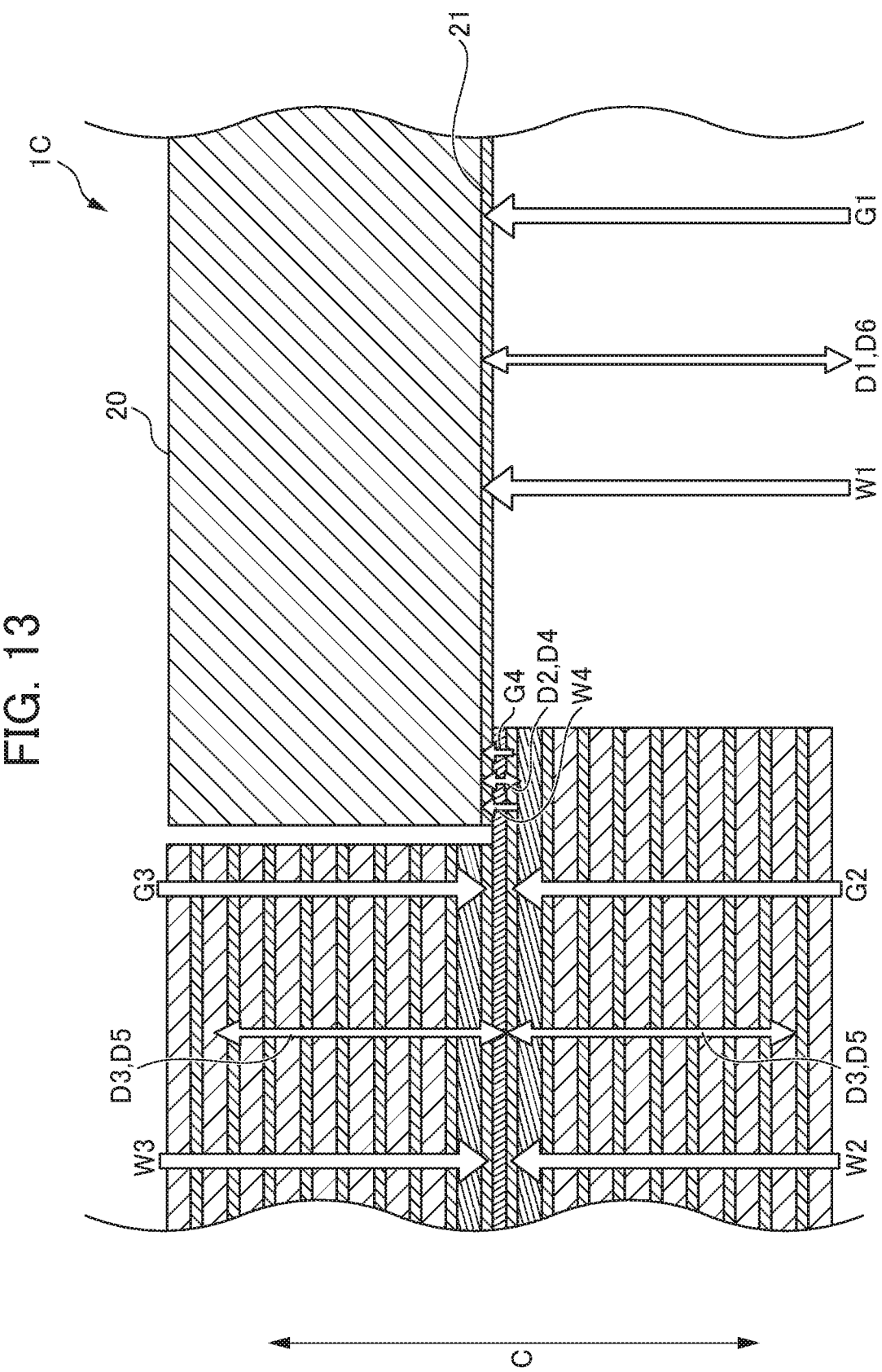
FIG. 13 is a conceptual diagram illustrating a flow of power supply and data communication in the semiconductor module according to the fourth embodiment.

Next, operations of the semiconductor module 1C will be described. As illustrated in FIG. 13, the second interposer 60 is supplied with the power W3 from the third interposer or the package substrate 80 via the bonding wires 70. The other RAM unit 30b is supplied with the power W3 from the second interposer 60. The other RAM unit 30b is ground-connected (ground G3) to the second interposer 60.

The semiconductor module 1C according to the fourth embodiment as described above has the following effects.

(9) The semiconductor module 1C is configured to further include the second interposer 60 placed on the other RAM unit 30b, the third interposer or package substrate 80 on which the first interposer 10 is placed, and the bonding wire 70 that electrically connects the second interposer 60 and the third interposer or the package substrate 80. Accordingly, power can be separately supplied to each of the pair of RAM units 30, so that it is possible to stably supply power to the RAM unit 30.

Fifth Embodiment

Figure 14:
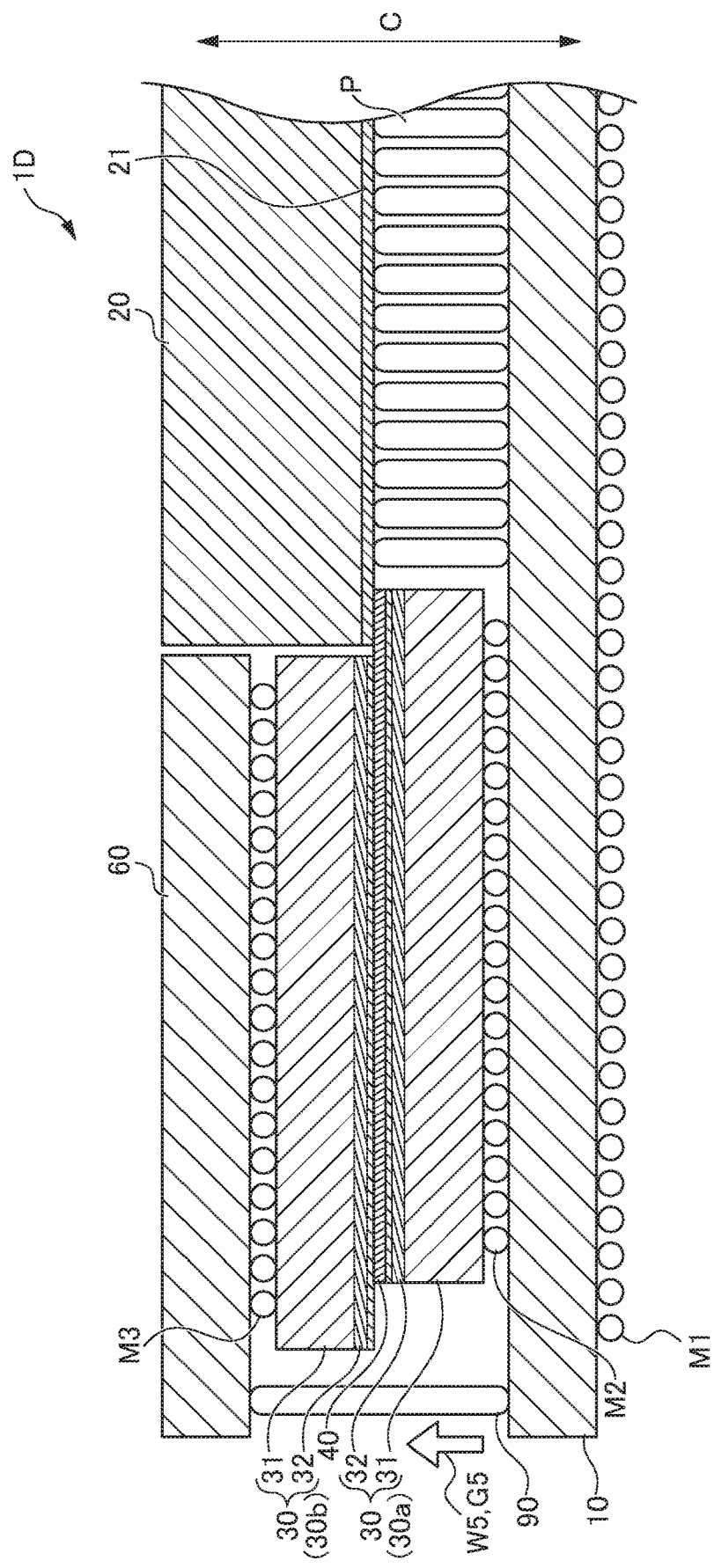
FIG. 14 is a cross-sectional view illustrating a semiconductor module according to a fifth embodiment of the invention.

Next, a semiconductor module 1D according to a fifth embodiment of the invention will be described with reference to FIG. 14. In the description of the fifth embodiment, the same components are denoted by the same reference numerals, and the description thereof is omitted or simplified. The semiconductor module 1D according to the fifth embodiment is different from the fourth embodiment in that a conductive columnar member 90 is provided instead of the bonding wire 70 as illustrated in FIG. 14.

The columnar member 90 is, for example, a Cu pillar and is disposed so as to supply a power W5 and a ground G5 to the other RAM unit 30b. One end of the columnar member 90 is connected to the upper surface of the first interposer 10, and the other end thereof is connected to the lower surface of the second interposer 60. A plurality of columnar members 90 are disposed along the side of the position that is farthest from the MPU 20, among the four sides of the lower surface of the second interposer 60. In other words, a plurality of the columnar members 90 are disposed along the farther side of the two sides disposed along the outer periphery of the MPU 20 on the lower surface of the second interposer 60. In the embodiment, six columnar members 90 are disposed for each pair of RAM units 30 (second interposer 60).

Next, operations of the semiconductor module 1D will be described. As illustrated in FIG. 14, the second interposer 60 is supplied with power W5 from the first interposer 10 via the columnar member 90. The second interposer 60 is ground-connected (ground G5) to the first interposer 10.

The semiconductor module 1D according to the fifth embodiment as described above has the following effects.

(10) The semiconductor module 1D is configured to further include the second interposer 60 placed on the other RAM unit 30b, and the columnar member 90 that electrically connects the first interposer 10 and the second interposer 60. Accordingly, power can be separately supplied to each of the pair of RAM units 30, so that it is possible to stably supply power to the RAM units 30. In addition, since the other end of the columnar member 90 is connected to the lower surface of the second interposer 60 facing the other RAM unit 30b, both the connection position of the columnar member 90 and the connection position of the other RAM unit 30b can be disposed to the lower surface side of the second interposer 60. Accordingly, since the power (power W3 and power W5) and the ground (ground G3 and ground G5) can be supplied from the columnar member 90 to the other RAM unit 30b without penetrating the second interposer 60, it is possible to reduce the manufacturing cost of the semiconductor module 1D.

Sixth Embodiment

Next, a semiconductor module according to the sixth embodiment of the invention will be described. In the description of the sixth embodiment, the same components are denoted by the same reference numerals, and the description thereof is omitted or simplified. The semiconductor module according to the sixth embodiment is different from the first to fifth embodiments in that the heat sink unit 50 includes a spacer member (not illustrated). In a case where there is a step difference between the upper surface of the MPU 20 and the upper surface of the other RAM unit 30b, the spacer member is formed with a thickness that buries the step difference. The spacer member is adjacent to at least one of the other RAM unit 30b and the MPU 20. The spacer member is formed with a facing surface being a flat so as to be in contact with the upper surface of the other RAM unit 30b or the MPU 20.

The semiconductor module according to the sixth embodiment as described above has the following effects.

(11) The heat sink unit is configured to include at least a spacer member adjacent to one of the other RAM unit 30b and the MPU 20. Accordingly, even in a case where there is no surface between the RAM unit and the MPU 20, the heat sink unit can be installed.

While the preferred embodiments of the semiconductor module according to the invention have been described above, the invention is not limited to the above-described embodiments and can be modified as appropriate.

For example, in the above-described embodiment, the power supply terminal and the ground terminal that connect the laminated dies 33b are formed by bumpless TSV, and the signal line is formed by TCI. In addition, the combination of the power supply terminal and the ground terminal that connect the interface chip 32 and the memory unit 31 is formed by bumpless TSV, and the signal line is formed by TCI. However, the invention is not limited thereto. For example, the combinations illustrated in Table 1 below can be used.

TABLE 1

| | Power supply terminal in lamination direction of RAM unit | Signal line in lamination direction of RAM unit |
| --- | --- | --- |
| 1 | Bumpless TSV | TCI |
| 2 | Bumpless TSV | TSV + Hybrid Bonding |
| 3 | Bumpless TSV | Bumpless TSV |
| 4 | TSV + Hybrid Bonding | TCI |
| 5 | TSV + Hybrid Bonding | TSV + Hybrid Bonding |
| 6 | TSV + Hybrid Bonding | Bumpless TSV |
| 7 | ACF | TCI |
| 8 | ACF | ACF |

In addition, TCI is an abbreviation for ThruChip Interface.

In addition, in the above-described embodiment, the connection unit 40 is an ACF, but the invention is not limited thereto. For example, the connection unit 40 can be configured as illustrated in Table 2 below.

TABLE 2

| | Power supply between RAM units | Signal line between RAM units | Power supply between MPU and RAM unit | Signal line between MPU and RAM unit |
| --- | --- | --- | --- | --- |
| 1 | ACF | ACF | ACF | ACF |
| 2 | ACF | TCI | ACF | TCI |
| 3 | Hybrid Bonding | Hybrid Bonding | Hybrid Bonding | Hybrid Bonding |
| 4 | Hybrid Bonding | TCI | Hybrid Bonding | TCI |
| 5 | Micro bump | Micro bump | Micro bump | Micro bump |
| 6 | Micro bump | TCI | Micro bump | TCI |

In the fourth embodiment, the heat sink unit 50 may be formed to have a size that does not overlap the connection portion between the bonding wire 70 and the second interposer 60. As another modified example, the heat sink unit 50 may have a spacer member having a height larger than the height of the bonding wire 70 from the second interposer 60 and having a size that does not overlap the connection portion between the bonding wire 70 and the second interposer 60.

In the above-described embodiment, the power W1 and the power W2 are supplied from the first interposer 10 to the MPU 20 and the pair of RAM units 30, but the invention is not limited thereto. For example, as illustrated in FIG. 5, the power W4 and the ground G4 may be supplied from the MPU 20, and on the contrary, the power W4 and the ground G4 may be supplied from the pair of RAM units 30.

In addition, the arithmetic unit is not limited to the MPU and may be widely applied to all logic chips. The memory is not limited to the DRAM and may be applied to all random access memories (RAMS) including a wide range of non-volatile RAMS (for example, MRAMs, ReRAMs, FeRAMs, and the like).

EXPLANATION OF REFERENCE NUMERALS

1, 1A, 1B, 1C, 1D SEMICONDUCTOR MODULE
10 FIRST INTERPOSER
20 MPU
30 PAIR OF RAM UNITS
30a ONE RAM UNIT
30b OTHER RAM UNIT
31 MEMORY UNIT
32 INTERFACE CHIP
40 CONNECTION UNIT
50 HEAT SINK UNIT
60 SECOND INTERPOSER
70 BONDING WIRE
80 THIRD INTERPOSER OR PACKAGE SUBSTRATE

The invention claimed is:

1. A semiconductor module comprising:
a logic chip;
a RAM unit, which is configured with a lamination-type RAM module;
a first interposer electrically connected to the logic chip and the RAM unit; and
a connection unit that communicatively connects the logic chip and the RAM unit,
wherein the RAM unit is placed on the first interposer and has one end portion disposed so as to overlap one end portion of the logic chip with the connection unit therebetween in a lamination direction,
the logic chip is supplied with a power and a ground from the first interposer,
the RAM unit is supplied with a power and a ground from the first interposer, and
the logic chip is supplied with a power and a ground from the RAM unit via the connection unit.

2. A semiconductor module comprising:
a logic chip;
a RAM unit, which is configured with a lamination-type RAM module;
a first interposer electrically connected to the logic chip and the RAM unit; and
a connection unit that communicatively connects the logic chip and the RAM unit,
wherein the RAM unit is placed on the first interposer and has one end portion disposed so as to overlap one end portion of the logic chip with the connection unit therebetween in a lamination direction,
the logic chip is supplied with a power and a ground from the first interposer,
the RAM unit is supplied with a power and a ground from the first interposer, and
the RAM unit is further supplied with a power and a ground from the logic chip via the connection unit.

3. The semiconductor module according to claim 1, wherein the RAM unit includes:
a memory unit in which memory circuits are laminated; and
an interface chip laminated on one end side of the memory unit.

4. The semiconductor module according to claim 1, wherein the RAM unit is disposed so as to overlap an end portion of at least one side of an outer periphery of the logic chip in the lamination direction.

* * * * *